United States Patent
Srinivasan et al.

(10) Patent No.: US 9,811,284 B2
(45) Date of Patent: Nov. 7, 2017

(54) ONE-PASS PROGRAMMING IN A MULTI-LEVEL NONVOLATILE MEMORY DEVICE WITH IMPROVED WRITE AMPLIFICATION

(71) Applicant: Apple Inc., Cupertino, CA (US)

(72) Inventors: Charan Srinivasan, San Jose, CA (US); Eyal Gurgi, Petach Tikva (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/975,789

(22) Filed: Dec. 20, 2015

(65) Prior Publication Data

US 2017/0177265 A1    Jun. 22, 2017

(51) Int. Cl.
| | |
|---|---|
| G06F 12/00 | (2006.01) |
| G06F 3/06 | (2006.01) |
| G11C 11/56 | (2006.01) |
| G11C 16/34 | (2006.01) |

(52) U.S. Cl.
CPC .......... *G06F 3/0638* (2013.01); *G06F 3/0604* (2013.01); *G06F 3/0629* (2013.01); *G06F 3/0679* (2013.01); *G11C 11/5628* (2013.01); *G11C 11/5642* (2013.01); *G11C 16/3436* (2013.01)

(58) Field of Classification Search
CPC .... G06F 3/0638; G06F 3/0679; G06F 3/0604; G06F 3/0629; G11C 11/5628; G11C 16/3436; G11C 11/5642
USPC .......................................................... 711/103
See application file for complete search history.

(56) References Cited

U.S. PATENT DOCUMENTS

| | | | |
|---|---|---|---|
| 7,532,495 B2 | 5/2009 | Youn et al. | |
| 7,778,087 B2 | 8/2010 | Tu et al. | |
| 2002/0149963 A1* | 10/2002 | De Sandre | G11C 11/5621 365/185.03 |
| 2007/0070699 A1* | 3/2007 | Lee | G11C 7/14 365/185.17 |
| 2011/0138105 A1* | 6/2011 | Franceschini | G06F 12/0246 711/103 |
| 2011/0280068 A1* | 11/2011 | Patapoutian | G11C 11/5628 365/185.03 |
| 2012/0271982 A1* | 10/2012 | Callaghan | G11C 16/10 711/103 |
| 2012/0317377 A1 | 12/2012 | Palay et al. | |
| 2013/0227198 A1 | 8/2013 | Lee | |
| 2013/0279250 A1 | 10/2013 | Park et al. | |
| 2014/0047163 A1 | 2/2014 | Kwak | |

(Continued)

*Primary Examiner* — Tuan Thai
*Assistant Examiner* — Tasnima Matin
(74) *Attorney, Agent, or Firm* — D. Kligler IP Services Ltd.

(57) ABSTRACT

A method for data storage includes preparing first data having a first size for storage in a memory device that stores data having a nominal size larger than the first size, by programming a group of memory cells to multiple predefined levels using a one-pass program-and-verify scheme. The first data is combined with dummy data to produce first combined data having the nominal size, and is sent to the memory device for storage in the group. The dummy data is chosen to limit the levels to which the memory cells in the group are programmed to a partial subset of the predefined levels. In response to identifying second data to be stored in the group, the second data is combined with the first data to obtain second combined data having the nominal size, and is sent to the memory device for storage, in place, in the group.

15 Claims, 3 Drawing Sheets

(56) References Cited

U.S. PATENT DOCUMENTS

| | | | |
|---|---|---|---|
| 2014/0198570 A1* | 7/2014 | Hsieh | G11C 16/10 365/185.03 |
| 2014/0219020 A1 | 8/2014 | Kwak et al. | |
| 2014/0254263 A1* | 9/2014 | Avila | G11C 16/10 365/185.03 |
| 2015/0081952 A1* | 3/2015 | D'Abreu | G06F 12/0246 711/103 |
| 2015/0143029 A1 | 5/2015 | Sivasankaran et al. | |
| 2015/0170747 A1* | 6/2015 | Liu | G11C 16/107 365/185.03 |

* cited by examiner

ONE-PASS PROGRAMMING IN A MULTI-LEVEL NONVOLATILE MEMORY DEVICE WITH IMPROVED WRITE AMPLIFICATION

TECHNICAL FIELD

Embodiments described herein relate generally to data storage, and particularly to methods and systems for storing data in a multi-level memory device using one-pass programming techniques.

BACKGROUND

Some types of memory devices comprise memory cells that store data by programming the memory cells to respective programming levels, selected from among multiple predefined programming levels. Programming the memory cells can be carried out in various ways. For example, to program a group of memory cells using a program-and-verify scheme, the memory device applies a sequence of programming pulses to the memory cells in the group, and verifies the states of the cells between consecutive programming pulses.

Program-and-verify schemes are known in the art. For example, U.S. Patent Application Publication 2014/0198570, whose disclosure is incorporated herein by reference, describes a memory that stores multiple bits per cell and is operated by applying a one-pass, multiple-level programming, such as an incremental pulse program sequence, with program verify steps for multiple target program levels, to program multiple bits per cell in a plurality of memory cells. Variants of the one-pass, multiple-level programming operation can be adopted for a variety of memory cell types, memory architectures, programming speeds, and data storage densities.

As another example, U.S. Patent Application Publication 2014/0219020, whose disclosure is incorporated herein by reference, describes a memory system that includes a non-volatile memory device, and a memory controller that is configured to control the nonvolatile memory device such that memory cells connected with a selected row of the nonvolatile memory device are programmed by one of a first program mode and a second program mode. At the first program mode, a plurality of logical pages corresponding in number to a maximum page number is stored at the memory cells, and at the second program mode, one or more logical pages the number of which is less than the maximum page number are stored at the memory cells using a bias condition that is different from that used in the first program mode.

A memory device is typically configured to store data in units of one or more pages. In some storage systems, however, the data available for storage at a given point in time may have a size that is different from the storage unit of the memory device.

Methods for handling the storage of data chunks whose size does not fit the storage unit of the memory device are known in the art. For example, U.S. Patent Application Publication 2015/0143029, whose disclosure is incorporated herein by reference, describes a memory system or flash card, which may include a controller that indexes a global address table (GAT) with a single data structure that addresses both large and small chunks of data. The GAT may include both large logical groups and smaller logical groups for optimizing write amplification. The addressing space may be organized with a large logical group size for sequential data. For fragmented data, the GAT may reference an additional GAT page or additional GAT chunk that has a smaller logical group size.

As another example, U.S. Patent Application Publication 2013/0227198, whose disclosure is incorporated herein by reference, describes a flash memory device and an electronic device employing thereof designed for efficiently processing data that is larger than a page size of a data block and for processing data that is smaller than the page size of the data block. The flash memory device preferably includes a plurality of flash arrays therein and the plurality of flash arrays is divided into partitions depending on at least two or more page sizes, thereby advantageously improving the performance of random write.

SUMMARY

Embodiments described herein provide a method for data storage, including preparing first data having a first size for storage in a memory device that stores data having a nominal size larger than the first size, by programming a group of memory cells to multiple predefined levels using a one-pass program-and-verify scheme. The first data is combined with dummy data to produce first combined data having the nominal size, and is sent to the memory device for storage in the group. The dummy data is chosen to limit the levels to which the memory cells in the group are programmed to a partial subset of the predefined levels. In response to identifying second data to be stored in the group, the second data is combined with the first data to obtain second combined data having the nominal size, and is sent to the memory device for storage, in place, in the group.

In some embodiments, the first data includes a most significant bit (MSB) page, the second data includes a least significant bit (LSB) page, the size of each of the MSB page and the LSB page is half the nominal data size, and each of the memory cells in the group is programmable to one of four programming levels associated with respective two-bit combinations that each includes a respective bit from the MSB page and a respective bit from the LSB page. In other embodiments, the dummy data includes all-ones bits. In yet other embodiments, combining the second data with the first data includes retrieving the first data from the memory device, and combining the second data with the retrieved first data.

In an embodiment, retrieving the first data includes setting one or more reading thresholds independently of whether the second combined data has been programmed or not. In another embodiment, the memory device applies a first mapping between bit-combinations and the multiple programming levels, a different second mapping between the bit-combinations and the multiple programming levels, and the first mapping and second mapping are used for programming and reading the first combined data and the second combined data, respectively. In yet another embodiment, sending the first combined data includes indicating to the memory device to program the first combined data using the first mapping, and sending the second combined data includes indicating to the memory device to program the second combined data using the second mapping.

In some embodiments, the method includes reading the first data from the memory device by setting one or more reading thresholds whose number and values depend on whether the second combined data is programmed or not. In other embodiments, a joint size of the first and second data is less than the nominal data size, and combining the second data with the first data includes padding all-ones bits outside boundaries of the first and second data to fill the combined second data up to the nominal data size. In yet other embodiments, the memory device includes a three-dimensional cell array that includes the group of the memory cells.

There is additionally provided, in accordance with an embodiment that is described herein, a data storage apparatus including an interface and a processor. The interface is configured to communicate with a memory device that is designed to store data having a nominal data size by programming a group of memory cells to multiple predefined programming levels using a one-pass program-and-verify scheme in which multiple programming levels are verified between consecutive programming pulses. The processor is configured to combine first data having a first data size smaller than the nominal data size with dummy data to produce first combined data having the nominal data size and to send the first combined data to the memory device for storage in the group of the memory cells. The dummy data is chosen to limit the programming levels to which the memory cells in the group are programmed to a partial subset of the predefined programming levels. In response to identifying second data to be stored in the group, the processor is configured to combine the second data with the first data to obtain second combined data having the nominal data size, and to send the second combined data to the memory device for storage, in place, in the memory cells in the group that are already programmed to the partial subset of the programming levels.

These and other embodiments will be more fully understood from the following detailed description of the embodiments thereof, taken together with the drawings in which:

DETAILED DESCRIPTION OF EMBODIMENTS

Overview

Figure 1:
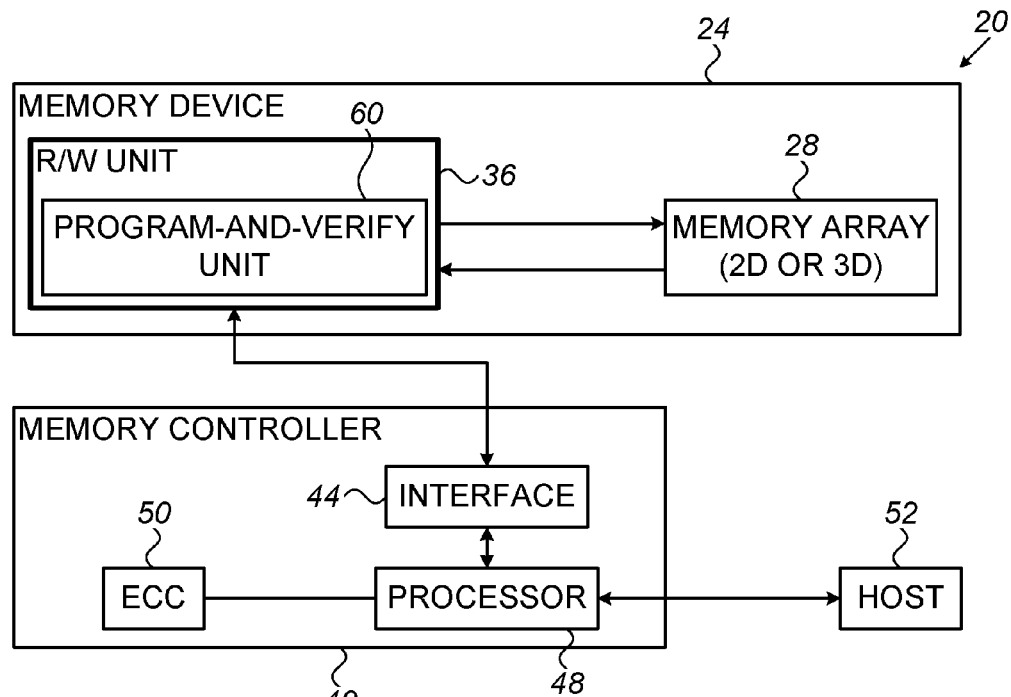
FIG. 1 is a block diagram that schematically illustrates a memory system, in accordance with an embodiment that is described herein.

In various storage systems, a memory controller stores data in a memory device that comprises multiple memory cells. Multi-Level Cell (MLC) devices store two or more bits per memory cell, i.e., can be programmed to assume more than two possible memory states. For example, in a memory device that stores two bits per cell, each cell is programmed to a programming level selected from among four predefined programming levels. In various memory technologies, such as Flash memories, the memory cells are conventionally written only after being erased. In addition, the memory cells are erased in blocks that are typically larger than the storage unit.

A memory device is typically configured to store data in storage units comprising one or more data pages. In various situations, however, the amount of data available for storage at a given time may be smaller than the storage unit of the memory device.

Consider a memory device that programs data in full storage units. In principle, the memory device can store a data chunk smaller than the storage unit in a group of memory cells, by retrieving data previously programmed to the group, combining the retrieved data with the currently available data and programming the combined data to another group of memory cells. In this approach, the memory device stores data in arbitrarily-small data chunks that jointly make up the full storage unit by separately programming the individual data chunks. Such a solution, however, incurs considerable write amplification (i.e., programming a single storage unit involves multiple programming operations to different groups of memory cells). The phenomenon of write amplification is undesirable since it increases the number of program-and-erase (P/E) cycles applied to the memory cells and therefore shortens the device's life. Embodiments that are described herein provide improved methods and systems for storing data in a MLC device that programs data using one-pass programming techniques. In the disclosed embodiments, the memory device programs data to a common group of cells in chunks smaller than the device's storage unit. The disclosed techniques incur little or no write amplification.

The disclosed embodiments refer mainly to a four-level memory device that is designed to store data in storage units of two data pages. The device programs data using a one-pass programming scheme in which multiple programming levels (e.g., all the programming levels) are verified between consecutive programming pulses. For example, the memory device may apply an incremental step pulse programming (ISPP) scheme in which the pulse voltage increases between consecutive programming pulses. The memory cells in the device can be arranged in a two-dimensional (2-D) or a three-dimensional (3-D) configuration. Using one-pass programming is especially suitable for certain types of 3-D devices, which due to their 3-D structure suffer less errors caused by program disturb and electrostatic interference than 2-D devices.

In some disclosed embodiments, the memory controller stores two-page data in the memory device in two separate programming phases (even though the basic storage unit of the memory device is two pages). In the first phase the memory controller stores a most significant bit (MSB) page, and in the second phase the memory controller stores a least significant bit (LSB) page. In the first phase, the memory controller combines the MSB page with dummy data that replaces the LSB page, which is expected by the memory device but is unavailable at this point. The dummy data is selected so as to limit the programming levels in the first phase to a partial subset of the predefined programming levels, leaving one or more un-programmed levels for subsequent programming in the second phase. In some embodiments, the predefined programming levels are denoted L0 . . . L3 in increasing order of threshold voltages, and by selecting the dummy data to all-ones bits, the memory cells are programmed in the first phase only to levels L0 and L1 having the lower threshold voltages.

When the LSB page becomes available, the memory controller applies the second programming phase, in which the memory controller retrieves the MSB page from the memory device, combines the retrieved MSB page with the LSB data and sends the MSB+LSB two-page storage unit to the memory device. The memory device programs the MSB+LSB data in the same group of the memory cells that was previously programmed with the MSB+Dummy data, without erasing the cells. Since the programming in the second phase is carried out "in place" and with no initial erasure, the re-programming incurs no write amplification. In some embodiments, instead of retrieving the MSB page to be combined in the second phase from the memory device, the MSB data is available within the memory controller or alternatively can be requested from a host connected to the memory controller.

In some embodiments, the memory device uses the same mapping between bit-combinations and programming levels in the first and second programming phases. In other embodiments, the mapping of bit-combinations to programming levels in the second phase is different from the mapping used in the first phase. In such embodiments, reading the MSB page requires different reading thresholds after programming the MSB+Dummy data in the first phase or the MSB+LSB data in the second phase.

In some embodiments, the memory controller manages the programming process by maintaining programming status, which indicates whether a group of cells is erased, partially programmed following the first phase or fully programmed following the second phase. In some embodiments, the memory device stores the programming status (e.g., per word line) in special dedicated flag cells that are inaccessible to the memory controller. In alternative embodiments, e.g., when the memory controller has sufficient available storage space, the memory controller manages the programming status and indicates this status to the memory device along with the data for storage.

In some embodiments, the memory controller delivers to the memory device data for storage in a given group of memory cells in data chunks smaller than the page size. The principles of storing MSB and LSB pages, as described above, are applicable also for storing a MSB chunk and a LSB chunk in a common subset of the group of the memory cells. In addition, however, when storing an individual data chunk, the memory controller sets the data outside the chunk boundaries with dummy bits corresponding to level L0. In some embodiments, the dummy bits comprise all-ones bits. Alternatively, other suitable dummy bits can also be used. The memory device identifies these dummy bits as mapped to the erasure level L0, and inhibits the respective cells from being programmed.

The disclosed techniques may be implemented mainly in the memory controller and thus employ a conventional memory device with little or no adaptation.

System Description

FIG. 1 is a block diagram that schematically illustrates a memory system 20, in accordance with an embodiment that is described herein. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks, each comprising multiple analog memory cells. The memory cells can be arranged in a two-dimensional (2-D) or a three-dimensional (3-D) configuration, as will be described below. In the context of the present patent application the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 2 (or 3) bit/cell MLC can be programmed to assume one of four (or eight) possible programming states by writing one of four (or eight) possible nominal storage values into the cell.

Memory device 24 comprises a reading/writing (R/W) unit 36, which converts data for storage in the memory device to analog storage values and writes them into the memory cells. In alternative embodiments, the R/W unit does not perform the conversion, but is provided with voltage samples, i.e., with the storage values for storage in the cells. When reading data out of array 28, R/W unit 36 converts the storage values of the memory cells into digital samples having a resolution of one or more bits. Data is typically written to and read from the memory cells in groups that are referred to as pages. In some embodiments, the R/W unit can erase a group of the memory cells by applying one or more negative erasure pulses to the cells. Erasure is typically performed in entire memory blocks.

The memory device comprises a program-and-verify unit 60 that programs data in array 28. In the present example, unit 60 is part of R/W unit 36. Alternatively, unit 60 can be implemented within the memory device as a separate module. In the disclosed embodiments, unit 60 is designed to program data in array 28 in units having a nominal data size. Unit 60 applies a one-pass programming scheme in which unit 60 applies to the memory cells to be programmed a sequence of programming pulses, and verifies multiple programming levels (typically all the predefined programming levels) between consecutive programming pulses.

In some embodiments, the voltage of the programming pulses increases between consecutive pulses in the sequence. Such a scheme is also referred to as an "incremental step pulse programming" (ISPP) scheme. Alternatively, any other one-pass programming scheme can also be used.

In some embodiments, unit 60 holds a set of programming parameters that are also referred to as "trim parameters" for controlling the programming process. Unit 60 holds the programming parameters, for example, in one or more registers (not shown). The programming parameters include, for example, the voltage value assigned to the first programming pulse in the sequence (also referred to as "start voltage"), a step-up voltage value between consecutive programming pulses, a pulse-width parameter of the programming pulses, a maximal number of programming pulses to apply and the like. Alternatively or additionally, other suitable programming parameters can also be used. The programming parameters are typically determined during device production.

The storage and retrieval of data in and out of memory device 24 is performed by a memory controller 40. The memory controller comprises an interface 44 for communicating with memory device 24, a processor 48 that carries out the various memory management functions, and an Error Correcting Code (ECC) unit 50. In some embodiments, processor 48 may include one or more processors or processing cores.

Memory controller 40 communicates with a host 52, for accepting data for storage in the memory device and for outputting data retrieved from the memory device. ECC unit 50 encodes the data for storage using a suitable ECC and decodes the ECC of data retrieved from the memory. Any suitable type of ECC, such as, for example, Low Density Parity Check (LDPC), Reed-Solomon (RS) or Bose-Chaudhuri-Hocquenghem (BCH), can be used. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity. Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, the memory cells are arranged in a 2-D cell array that comprises multiple rows and columns, and each memory cell comprises a floating-gate transistor. The gates of the transistors in each row are connected by word lines, and the sources of the transistors in each column are connected by bit lines.

In an alternative configuration of array 28, the memory cells are arranged in a 3-D cell array that comprises multiple 3-D blocks. The three dimensions of the memory blocks are associated with bit lines, word lines and sections, respectively. Each of the sections is selected using a respective pair of a section select line and a ground select line. A 3-D block may comprise, for example, four or more sections, and in some embodiments eight or even sixteen sections. The word lines, bit lines, section select lines and ground select lines are accessed by R/W unit 36. Due to the 3-D structure, program disturb typically causes less errors in 3-D devices than in 2-D devices, and therefore 3-D devices are especially suitable for employing one-pass programming.

The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In 3-D configurations, a page of data is typically written by R/W unit 36 to a group of memory cells that belongs to a certain word line and lies in a certain section.

Typically, memory controller 40 programs data in units of one or more pages, but erases entire memory blocks. Typically, although not necessarily, in a 2-D configuration, a memory block is on the order of $10^7$ memory cells, whereas a page is on the order of $10^4$-$10^5$ memory cells.

The description that follows describes several example techniques for data storage, in which the memory device is designed to store and retrieve data in storage units having some predefined nominal data size, and applies a one-pass program-and-verify scheme to program the data. The disclosed techniques can be carried out by memory controller 40 and/or by R/W unit 36. For the sake of clarity, the description that follows refers to a particular division of functions between R/W unit 36 in the memory device and processor 48 in memory controller 40. Generally, however, the various tasks making-up the disclosed techniques can be divided between the memory controller and the R/W circuitry in any suitable manner, or performed by any one of these elements. Thus, in the context of the present patent application and in the claims, memory controller 40 and R/W unit 36 are referred to jointly as storage circuitry that carries out the disclosed techniques.

Data Storage in Multi-Level Device Using a One-Pass Programming Scheme

Figure 2:
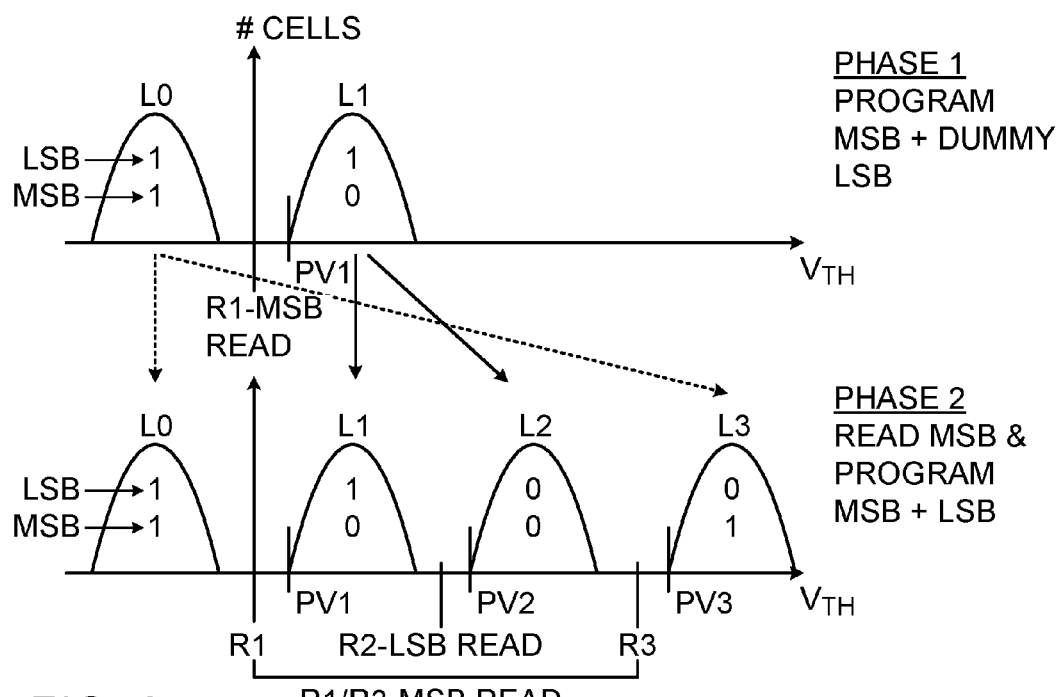
FIGS. 2 and 3 are diagrams depicting threshold voltage distributions in a Multi-Level Cell (MLC) device programmed using a one-pass programming scheme, in accordance with embodiments that are described herein.
Figure 3:
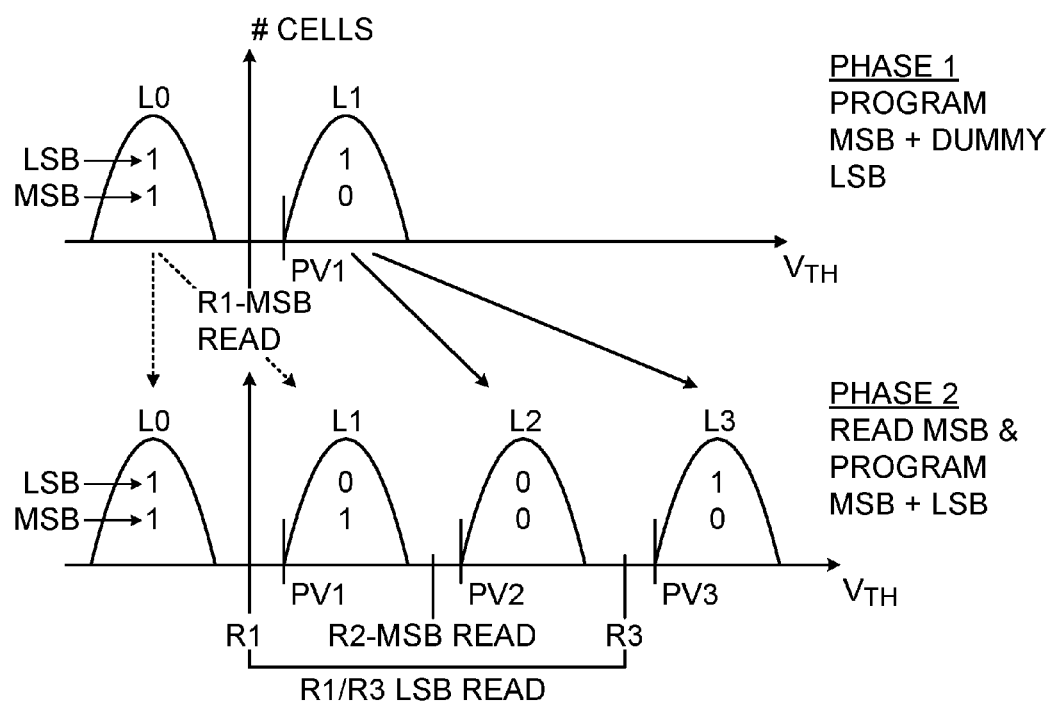

FIGS. 2 and 3 are diagrams depicting threshold voltage distributions in a Multi-Level Cell (MLC) device programmed using a one-pass programming scheme, in accordance with embodiments that are described herein. In FIGS. 2 and 3 we consider a memory device that stores two bits per cell, wherein two-bit combinations correspond to respective programming levels L0 ... L3.

The description that follows further assumes that program-and-verify unit 60 programs data in array 28 in a two-page unit, using a one-pass programming scheme such as the ISPP scheme, as described above. Unit 60 uses verification thresholds PV1, PV2 and PV3 for verifying that memory cells programmed to respective levels L1, L2 and L3, have reached the desired level. In FIGS. 2 and 3, reading data from array 28 involves setting one or more of the three reading thresholds R1, R2 and R3, which are positioned between L0-L1, L1-L2 and L2-L3, respectively.

Consider a case in which controller 40 has data for storage whose size is less than the full two-page size. For example, the controller may receive from the host only one page or less for storage at a given time. In FIGS. 2 and 3 we assume that the controller has only one full page available for storage at a time. For example, the controller may separately send to the memory device, at different occasions, a MSB page and a corresponding LSB page that should be both programmed to the same group of memory cells, e.g., in a common word line.

In FIGS. 2 and 3, the controller stores a MSB page and a LSB page in two separate phases, even though the basic storage unit of the memory device is two pages. In the first phase only the MSB page is available for storage. The controller combines the MSB page with dummy data to produce a two-page data unit, and sends the combined two-page data to the memory device. In the second phase, e.g., in response to receiving the LSB page from the host, the controller combines the MSB page previously programmed (e.g., by first retrieving the MSB page from the memory device) and sends the combined MSB+LSB data to the memory device for storage.

In the context of the present disclosure and in the claims, the term "dummy data" means data that does not contain information other than the information already conveyed in the MSB data.

The memory device programs the MSB+LSB data, in the memory cells previously programmed with the MSB and dummy data, without first erasing these cells and therefore this re-programming incurs no write amplification. In the context of the present disclosure and in the claims re-programming without erasure is referred as programming "in place."

In FIG. 2, the memory device programs the MSB page using a mapping between two-bit combinations and pro-gramming levels as depicted in Table 1.

TABLE 1

Mapping of bit-combinations to programming
levels in MSB page programming

| LS Bit | 1 | 1 | 0 | 0 |
|---|---|---|---|---|
| MS Bit | 1 | 0 | 0 | 1 |
| Level | L0 | L1 | L2 | L3 |

In the disclosed embodiments, the dummy data in the first phase comprises an all-ones page, i.e., a data page whose bits are all set to '1'. Consequently, even though unit 60 is designed to program the memory cells to levels L0 . . . L3 in one pass, forcing the LS bit to '1' results in programming each of the memory cells in the first phase to only one of the levels L1 or L0, based on the MSB page data.

In the second phase of FIGS. 2 and 3, the memory device programs MSB+LSB data, and assuming that the LSB page is not an all-ones page, the memory cells previously pro-grammed to only L1 or L0 are programmed in the second phase to all the levels L0 . . . L3. Note that the cells are not erased prior to being re-programmed in the second phase. When programming the MSB+LSB data in the second phase, cells corresponding to two-bit combinations in which the least significant bit is '1' are already programmed to their final level L0 or L1, whereas cells corresponding to two-bit combinations in which the least significant bit is '0' should be programmed to level L2 or L3.

In FIG. 2, programming in the second phase is carried out using the mapping depicted in Table 1. To program a '0' bit of the LSB page, cells that were programmed in the first phase to L0 and L1 are programmed in the second phase to L3 and L2, respectively.

As seen in FIG. 2, cells that were programmed to L1 in the first phase should retain their L1 level when programmed to least significant bit '1' in the second phase. When applying the sequence of programming pulses in the second phase, the first programming pulse in the sequence may undesirably increase the threshold voltage of the L1 cells, resulting in over programming of level L1. Methods for avoiding or reducing L1 over programming are described further below.

In some embodiments, to read the MSB page pro-grammed in the first phase, R/W unit 36 sets read thresholds R1 and R3. After completing the second phase, the R/W unit sets threshold R2 to read the LSB page, and thresholds R1 and R3 to read the MSB page. In this scheme, the same thresholds (R1 and R3) are used for reading the MSB page after completing each of the first and second phases.

The first phase, in which the memory device programs the MSB page using the mapping of Table 1 is similar in FIGS. 2 and 3. Therefore, in FIG. 3, after the first phase, the memory cells are programmed to only levels L0 and L1, as described above. In the second phase of FIG. 3, the memory device programs MSB+LSB pages using the mapping depicted in Table 2.

TABLE 2

Mapping bit-combinations to programming
levels in the second phase of FIG. 3

| LS Bit | 1 | 0 | 0 | 1 |
|---|---|---|---|---|
| MS Bit | 1 | 1 | 0 | 0 |
| Level | L0 | L1 | L2 | L3 |

As seen in FIG. 3, cells that were programmed to L0 in the first phase, and correspond to two-bit combinations in which the least significant bit is '0' in the second phase, are programmed to L1 in the second phase. Similarly, cells that were programmed to L1 in the first phase are programmed to L2 or L3 based on the least significant bit in the second phase being '0' or '1', respectively.

In FIG. 3, to read the MSB page after the first phase completes, the R/W unit sets threshold R1. After the second phase is completed, the R/W unit sets threshold R2 to read the MSB page, and thresholds R1 and R3 to read the LSB page. Therefore, assuming that the memory device is con-figured to read the MSB and LSB pages based on the mapping of Table 1, in FIG. 3, the controller sends to the device a command for reading the MSB page to actually read the LSB page, and a command for reading the LSB page to actually read the MSB page.

As described above, the memory device may behave differently during the first and second phases, e.g., use a different bits to level mapping in each phase, as described with reference to FIG. 3. In some embodiments, the memory device keeps track of the programming status of a group of memory cells, i.e., erased, partially programmed (with MSB and Dummy data) or fully programmed (with MSB and LSB data). The memory device may store the programming status of a group of memory cells in special dedicated cells denoted "flag cells".

The memory device may comprise one or more flag cells per word line for storing the programming status of the memory cells connected to that word line. In an embodi-ment, the memory device programs the programming status using dedicated programming levels that can be different from the programming levels used for storing user data. The memory device manages the flag cells internally and typi-cally the memory controller has no access to the program-ming status.

In some embodiments, the memory controller manages the programming status of the memory cells instead of or in addition to the flag cells described above. In one embodi-ment, the memory controller allocates part of the memory cells of the device for this purpose, and stores the programming status in these allocated memory cells. In this embodiment, the programming status is retained even at power down. Alternatively, the memory controller stores the programming status, using a suitable data base, in an internal memory of the memory controller.

Methods for Data Storage

Figure 4:
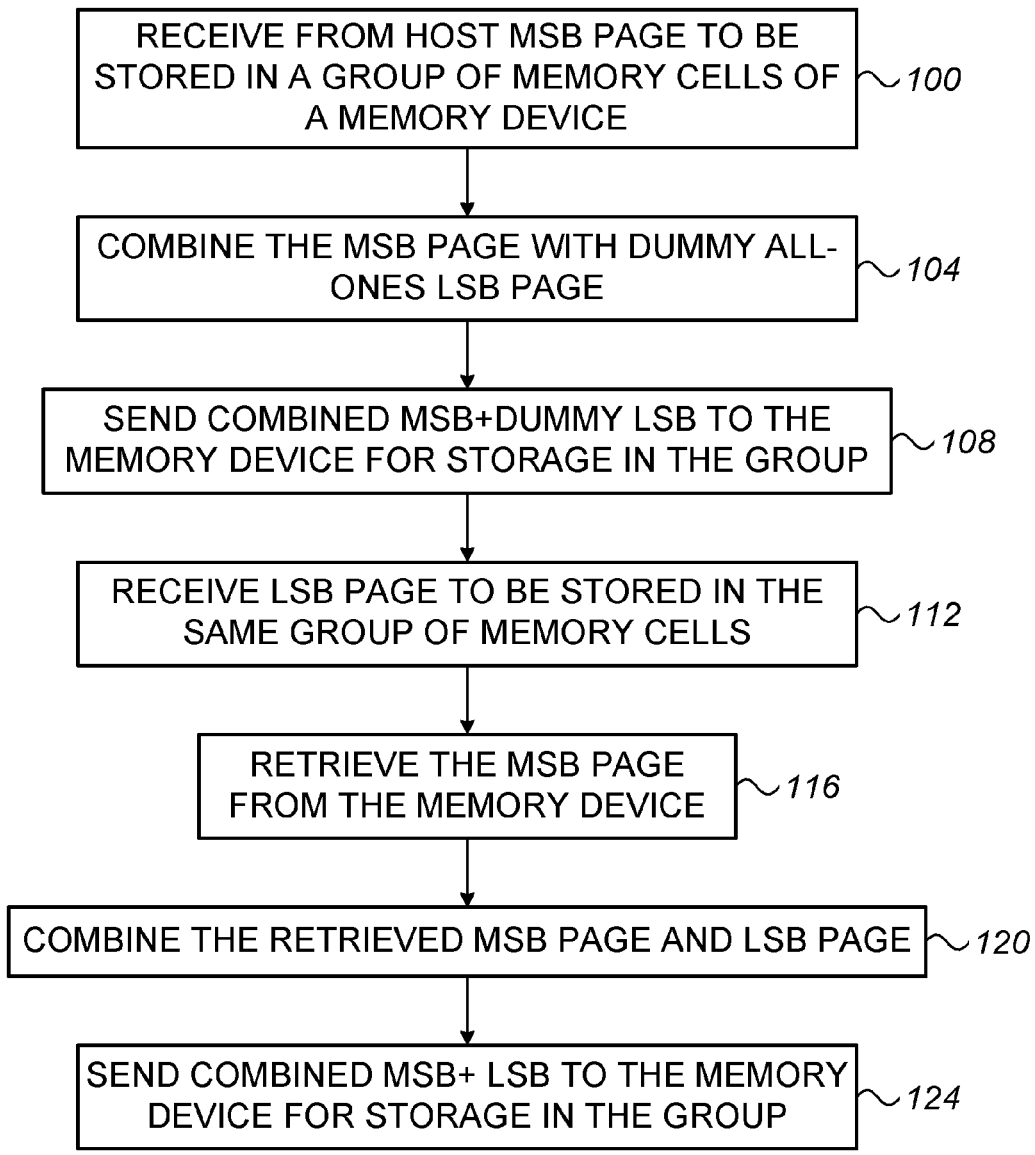
FIG. 4 is a flow chart that schematically illustrates a method for data storage, in accordance with an embodiment that is described herein.

FIG. 4 is a flow chart that schematically illustrates a method for data storage, in accordance with an embodiment that is described herein. The method is executed by memory controller 40 of FIG. 1.

The method begins with memory controller 40 receiving a MSB page from host 52, at a MSB page reception step 100. The memory controller is required to send the MSB page for storage in a given group of memory cells in array 28 of memory device 24. At a dummy combination step 104, the controller combines the MSB page with an all-ones dummy page that replaces the unavailable LSB page, as described above, and sends the combined two-page MSB+Dummy data to the memory device at a MSB storage step 108. The memory device stores the MSB+Dummy data as described above in the first phase of FIGS. 2 and 3, resulting in levels L0 and L1. At step 108, the memory device is unaware of receiving dummy data for storage in addition to the MSB page.

At an LSB reception step 112, the memory controller receives from the host an LSB page that should be stored in the memory cells that were programmed in the first phase to L0 and L1. At a MSB retrieval step 116, the memory controller first reads the MSB page from the memory device according to the mapping of Table 1.

At a MSB+LSB combination step 120, the memory controller combines the MSB page retrieved at step 116 with the LSB page received from the host to produce a two-page MSB+LSB data. The memory controller sends the combined MSB+LSB data for storage in the memory device, at a MSB+LSB programming step 124. In some embodiments, the memory device programs the combined MSB+LSB data using the mapping of Table 1 as described with reference to FIG. 2. In other embodiments, the memory device programs the MSB+LSB data based on the mapping of Table 2, as described with reference to FIG. 3. Following step 124, the method terminates.

As described above with reference to FIG. 2, programming the MSB+LSB data at step 120 may result in over programming of level L1. The level of over programming can be controlled by the start voltage value, i.e., the voltage of the first programming pulse in the one-pass sequence of programming pulses.

In some embodiments, over programming is eliminated or at least reduced significantly by reducing the start voltage in the second phase. Note that reducing the start voltage may result in increasing the second phase programming time. In an example embodiment, the memory device holds, as part of the programming parameters, both a regular and a reduced value for the start voltage parameter, and selects the value to be used based on an indication from the memory controller. More generally, the memory controller adjusts programming parameters based, for example, on the device wear out level.

In alternative embodiments, over programming of L1 in the second phase is avoided by the memory controller indicating to the memory device to inhibit the memory cells at level L1 from being programmed by the first programming pulse. Since in this method the cells programmed to L1 in the first phase are verified and thus identified before being programmed, the L1 cells can be inhibited from subsequent programming pulses. In yet further alternative embodiments, the memory device uses the retrieved MSB page to identify the cells programmed in the first phase to L1, and inhibits the identified cells from being programmed in the second phase. By using the methods for inhibiting L1 cells from being programmed in the second phase, L1 over programming is eliminated without having to increase the separation between L0 and L1, which additionally involves adapting the programming parameters.

Programming Chunks Smaller than a Page Size

In some embodiments, the controller is configured to store data chunks that are smaller than the page size. For example, the controller may receive from the host MSB and LSB pages in chunks whose size equals half a page, or any other chunk size smaller than a full page. Different data chunks may have the same size or different sizes.

Consider a memory controller that stores data in a memory device having a nominal data size for storage in the cell array. In the present example we assume a four-level MLC device that stores two-page nominal data size using a one-pass programming scheme. Data chunks that are contained in a MSB or LSB page are referred to herein as "MSB chunks" and "LSB chunks", respectively. In the disclosed embodiments, a data chunk is identified by 1) the location of the data chunk within the two-page data, 2) the chunk size and 3) the chunk being a MSB or LSB chunk.

The memory controller sends a chunk to the memory device for storage by positioning the chunk at the relevant location within the two-page data, and writing all-ones bits outside the chunk boundaries. As a result, although the controller sends to the memory device two-page data, the '11' bit-combinations are interpreted by the R/W unit as belonging to level L0, and therefore only the chunk data is actually programmed. The cells are re-written without being erased and therefore the re-programming does not cause write amplification.

In some embodiments, programming the MSB and LSB chunks is carried out similarly to programming full MSB and LSB pages. To program a MSB chunk, the memory controller combines the MSB chunk with dummy all-ones bits replacing the LSB chunk part, as well as all-ones bits outside the chunk boundaries. To program an LSB chunk, the memory controller retrieves the two-page data containing the MSB chunk from the memory device, extracts the MSB chunk and combines the extracted MSB chunk with the LSB chunk. The controller pads the data outside the chunk boundaries with '1' bits, and sends the resulting two-page data to the memory device for storage.

In some embodiments, the memory controller carries out the above described method for chunk programming with no awareness of the memory device. In other embodiments, the memory controller indicates to the memory device that the two-page data contains a chunk smaller than the page size. The indication comprises at least the chunk location within the page and the chunk size. In response to receiving such an indication, the memory device programs the data chunk efficiently, resulting in reduced programming time, and/or reduced current or power consumption.

The embodiments described above are given by way of example, and other suitable embodiments can also be used. For example, although the embodiments described above refer mainly to a four-level MLC device, in alternative embodiments, the disclosed techniques can be adapted to support other suitable MLC devices, such as, an eight-level MLC device.

In the embodiments described above, in the first programming phase, the memory controller combines the MSB data with all-ones bits as dummy data, resulting in only L0 and L1 levels. This choice is not mandatory and other suitable bit-patterns for the dummy data can also be used. For example, instead of being fixed, the dummy data may depend on the data to be programmed, e.g., in FIG. 2 duplicate the MSB data, resulting in programming only levels L0 and L2 in the first phase.

Although the disclosed techniques are described mainly with reference to memories that store two bits per cell, these techniques can be adapted to higher density devices that store four bits per cell, or more.

The disclosed techniques can be applied dynamically, e.g., switched in or out based on the host workload.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A data storage apparatus, comprising:
   an interface, which is configured to communicate with a memory device that is designed to store data having a nominal data size by programming a group of memory cells to multiple predefined programming levels using a one-pass program-and-verify scheme in which multiple programming levels are verified between consecutive programming pulses; and
   a processor, which is configured to:
      combine first data having a first data size smaller than the nominal data size with dummy data to produce first combined data having the nominal data size and send the first combined data to the memory device for storage in the group of the memory cells, wherein the dummy data is chosen to limit the programming levels to which the memory cells in the group are programmed to a partial subset of the predefined programming levels; and,
      in response to identifying second data to be stored in the group, retrieve the first data from the memory device, combine the second data with the retrieved first data to obtain second combined data having the nominal data size, and send the second combined data to the memory device for storage, in place, in the memory cells in the group that are already programmed to the partial subset of the programming levels,
   wherein the processor is configured to retrieve the first data from the memory device, for combining with the second data, by setting one or more reading thresholds independently of whether the second combined data has been programmed or not.

2. The apparatus according to claim 1, wherein the first data comprises a most significant bit (MSB) page, wherein the second data comprises a least significant bit (LSB) page, wherein the size of each of the MSB page and the LSB page is half the nominal data size, and wherein each of the memory cells in the group is programmable to one of four programming levels associated with respective two-bit combinations that each comprises a respective bit from the MSB page and a respective bit from the LSB page.

3. The apparatus according to claim 1, wherein the dummy data comprises all-ones bits.

4. The apparatus according to claim 1, wherein the memory device applies a first mapping between bit-combinations and the multiple programming levels, and a different second mapping between the bit-combinations and the multiple programming levels, wherein the first mapping and the second mapping are used for programming and reading the first combined data and the second combined data, respectively, and wherein the processor is configured to send the first combined data by indicating to the memory device to program the first combined data using the first mapping, and to send the second combined data by indicating to the memory device to program the second combined data using the second mapping.

5. The apparatus according to claim 1, wherein a joint size of the first and second data is less than the nominal data size, and wherein the processor is configured to combine the second data with the first data by padding all-ones bits outside boundaries of the first and second data to fill the combined second data up to the nominal data size.

6. The apparatus according to claim 1, wherein the memory device comprises a three-dimensional cell array that comprises the group of the memory cells.

7. A method for data storage, comprising:
   in a controller, preparing first data having a first data size for storage in a memory device that is designed to store data having a nominal data size larger than the first data size by programming a group of memory cells to multiple predefined programming levels using a one-pass program-and-verify scheme in which multiple programming levels are verified between consecutive programming pulses;
   combining, by the controller, the first data with dummy data to produce first combined data having the nominal data size, and sending the first combined data to the memory device for storage in the group of the memory cells, wherein the dummy data is chosen to limit the programming levels to which the memory cells in the group are programmed to a partial subset of the predefined programming levels; and
   in response to identifying, by the controller, second data to be stored in the group, retrieving the first data from the memory device, combining the second data with the retrieved first data to obtain second combined data having the nominal data size, and sending the second combined data to the memory device for storage, in place, in the memory cells in the group that are already programmed to the partial subset of the programming levels,
   wherein retrieving the first data for combining with the second data comprises setting one or more reading thresholds independently of whether the second combined data has been programmed or not.

8. The method according to claim 7, wherein the first data comprises a most significant bit (MSB) page, wherein the second data comprises a least significant bit (LSB) page, wherein the size of each of the MSB page and the LSB page is half the nominal data size, and wherein each of the memory cells in the group is programmable to one of four programming levels associated with respective two-bit combinations that each comprises a respective bit from the MSB page and a respective bit from the LSB page.

9. The method according to claim 7, wherein the dummy data comprises all-ones bits.

10. The method according to claim 7, wherein the memory device applies a first mapping between bit-combinations and the multiple programming levels, and a different second mapping between the bit-combinations and the multiple programming levels, and wherein the first mapping and the second mapping are used for programming and reading the first combined data and the second combined data, respectively.

11. The method according to claim 10, wherein sending the first combined data comprises indicating to the memory device to program the first combined data using the first mapping, and sending the second combined data comprises indicating to the memory device to program the second combined data using the second mapping.

12. The method according to claim 7, wherein a joint size of the first and second data is less than the nominal data size, and wherein combining the second data with the first data comprises padding all-ones bits outside boundaries of the first and second data to fill the combined second data up to the nominal data size.

13. The method according to claim 7, wherein the memory device comprises a three-dimensional cell array that comprises the group of the memory cells.

14. A data storage apparatus, comprising:
an interface, which is configured to communicate with a memory device that is designed to store data having a nominal data size by programming a group of memory cells to multiple predefined programming levels using a one-pass program-and-verify scheme in which multiple programming levels are verified between consecutive programming pulses; and
a processor, which is configured to:
combine first data having a first data size smaller than the nominal data size with dummy data to produce first combined data having the nominal data size and send the first combined data to the memory device for storage in the group of the memory cells, wherein the dummy data is chosen to limit the programming levels to which the memory cells in the group are programmed to a partial subset of the predefined programming levels;
in response to identifying second data to be stored in the group, combine the second data with the first data to obtain second combined data having the nominal data size, and to send the second combined data to the memory device for storage, in place, in the memory cells in the group that are already programmed to the partial subset of the programming levels; and
read the first data from the memory device by setting one or more reading thresholds whose number and values depend on whether the second combined data is programmed or not.

15. A method for data storage, comprising:
in a controller, preparing first data having a first data size for storage in a memory device that is designed to store data having a nominal data size larger than the first data size by programming a group of memory cells to multiple predefined programming levels using a one-pass program-and-verify scheme in which multiple programming levels are verified between consecutive programming pulses;
combining, by the controller, the first data with dummy data to produce first combined data having the nominal data size, and sending the first combined data to the memory device for storage in the group of the memory cells, wherein the dummy data is chosen to limit the programming levels to which the memory cells in the group are programmed to a partial subset of the predefined programming levels;
in response to identifying, by the controller, second data to be stored in the group, combining the second data with the first data to obtain second combined data having the nominal data size, and sending the second combined data to the memory device for storage, in place, in the memory cells in the group that are already programmed to the partial subset of the programming levels; and
reading the first data from the memory device by setting one or more reading thresholds whose number and values depend on whether the second combined data is programmed or not.

\* \* \* \* \*